(12) United States Patent
Hasegawa et al.

(10) Patent No.: US 9,232,643 B2
(45) Date of Patent: *Jan. 5, 2016

(54) CERAMIC WIRING BOARD, MULTI-PIECE CERAMIC WIRING BOARD, AND METHOD FOR PRODUCING SAME

(75) Inventors: Masami Hasegawa, Konan (JP); Satoshi Hirayama, Ichinomiya (JP); Naoki Kito, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 199 days.

This patent is subject to a terminal disclaimer.

(21) Appl. No.: 14/006,047

(22) PCT Filed: Feb. 1, 2012

(86) PCT No.: PCT/JP2012/000664
§ 371 (c)(1),
(2), (4) Date: Sep. 18, 2013

(87) PCT Pub. No.: WO2012/144115
PCT Pub. Date: Oct. 26, 2012

(65) Prior Publication Data
US 2014/0034372 A1 Feb. 6, 2014

(30) Foreign Application Priority Data

Apr. 19, 2011 (JP) ................................. 2011-092556

(51) Int. Cl.
*H05K 1/00* (2006.01)
*H05K 1/03* (2006.01)
(Continued)

(52) U.S. Cl.
CPC ............ *H05K 1/0298* (2013.01); *H05K 3/0029* (2013.01); *H05K 3/0052* (2013.01);
(Continued)

(58) Field of Classification Search
CPC ..... H05K 3/46; H05K 3/4605; H05K 1/0306; H05K 3/0044; H05K 3/0052; H05K 2201/09145; H05K 2201/09154; H05K 2201/09181; H05K 2203/0346
USPC ..................................... 174/255, 258; 29/846
See application file for complete search history.

(56) References Cited

U.S. PATENT DOCUMENTS 4,303,715 A * 12/1981 Chang ............................ 428/137
6,760,227 B2 * 7/2004 Sakai et al. .................... 361/736
(Continued)

FOREIGN PATENT DOCUMENTS

JP 2003-303915 A 10/2003
JP 2005-285865 A 10/2005
(Continued)

OTHER PUBLICATIONS

JPO/ISA, International Search Report issued in corresponding international application PCT/JP2012/000664, mailed May 22, 2012.
(Continued)

*Primary Examiner* — Sherman Ng
(74) *Attorney, Agent, or Firm* — Stites & Harbison, PLLC; Jeffrey A. Haeberlin (57) ABSTRACT

Provided are a ceramic wiring substrate; a multi-piece ceramic wiring substrate array for providing a plurality of the wiring substrates; and a method for reliably producing the wiring substrate array. The ceramic wiring substrate includes a substrate main body, which has a front surface, a back surface, side surfaces, a groove surface located on a side toward the front surface, and a fracture surface located on a side toward the back surface; and a notch which has a concave shape in plan view, and which is provided on at least one of the side surfaces so as to extend between the front surface and the back surface, wherein, in the side surface having the notch, the boundary between the groove surface and the fracture surface has curved portions on opposite sides of the notch, the curved portions being convex toward the front surface of the substrate main body in side view.

10 Claims, 5 Drawing Sheets

(51) Int. Cl.
  *H05K 3/10* (2006.01)
  *H05K 1/02* (2006.01)
  *H05K 3/00* (2006.01)
  *H05K 3/46* (2006.01)
  *H05K 3/40* (2006.01)

(52) U.S. Cl.
  CPC .............. *H05K 3/46* (2013.01); *H05K 1/0306* (2013.01); *H05K 3/403* (2013.01); *H05K 2201/0909* (2013.01); *H05K 2201/09154* (2013.01); *H05K 2201/09181* (2013.01); *H05K 2203/0346* (2013.01); *Y10T 29/49155* (2015.01)

(56) References Cited

U.S. PATENT DOCUMENTS

| | | | |
|---|---|---|---|
| 7,485,812 B2 * | 2/2009 | Olson et al. | 174/255 |
| 2005/0006138 A1 * | 1/2005 | Wang et al. | 174/255 |
| 2010/0133697 A1 | 6/2010 | Nilsson | |
| 2011/0315439 A1 | 12/2011 | Nakashima et al. | |
| 2013/0164935 A1 | 6/2013 | Nilsson | |

FOREIGN PATENT DOCUMENTS

| | | |
|---|---|---|
| JP | 2006-013004 A | 1/2006 |
| JP | 2008-198905 A | 8/2008 |
| JP | 2009-10103 A | 1/2009 |
| JP | 2009-218319 A | 9/2009 |
| JP | 2009-266992 A | 11/2009 |
| JP | 2010-225910 A | 10/2010 |
| JP | 2011-009400 A | 1/2011 |
| TW | 200910569 A | 3/2009 |

OTHER PUBLICATIONS

Taiwan Intellectual Property Office, Notification for the Opinion of Examination, issued in corresponding Taiwanese application No. 101113546, mailed Oct. 28, 2014.
European Patent Office, Extended European Search Report, from corresponding EP Application No. 12773834, dated Feb. 13, 2015.

* cited by examiner

CERAMIC WIRING BOARD, MULTI-PIECE CERAMIC WIRING BOARD, AND METHOD FOR PRODUCING SAME

TECHNICAL FIELD

The present invention relates to a ceramic wiring substrate having few burrs in the vicinity of a notch provided on a side surface of a substrate main body, in which a conductor layer provided on the inner wall of the notch exhibits excellent solderability; to a multi-piece ceramic wiring substrate array for providing a plurality of the wiring substrates; and to a method for producing the multi-piece ceramic wiring substrate array.

BACKGROUND ART

Generally, ceramic wiring substrates are produced by separating a multi-piece ceramic wiring substrate array into individual pieces along separation grooves provided on the front surface or back surface of the wiring substrate array. In connection therewith, there has been proposed a method for producing a multi-piece wiring substrate array, in which a blade having a specific edge angle is pressed against a surface of a green sheet laminate at positions where separation grooves are to be formed, so that chips or burrs are less likely to be generated at a metal layer, etc. located in the vicinity of the thus-formed separation grooves during separation of the substrate array (see, for example, Patent Document 1).

However, when separation grooves are formed in a green sheet by means of a blade through the production method described in Patent Document 1, since a fracture surface (cracking) meanders at the inner wall of a through hole which crosses with the thus-formed separation grooves in a radial direction of the through hole, irregularities or burrs are likely to be generated. Particularly when a metal conductor layer is formed on the inner wall of the through hole, burrs are likely to be generated through breakage of the metal layer, and a cut surface of the non-plated conductor layer is exposed after separation of the substrate array. Therefore, the conductor layer may exhibit poor reliability during soldering for mounting of a component on the conductor layer.

Also, there has been proposed a multi-piece wiring substrate array, in which a separation groove having different, discontinuous depths is formed by means of a blade having a single base and different edge heights (widths), so as to prevent burrs or cracks, which would otherwise be generated in association with a meandering fracture surface (cracking) at the inner wall of a through hole in a green sheet (see, for example, Patent Document 2).

However, in the case of the multi-piece wiring substrate array described in Patent Document 2, every time a through-hole-forming position is changed to any position which crosses with a separation groove, there must be provided a number of special blades having different edge heights (widths) and lengths corresponding to both a portion in the vicinity of the surface of a green sheet and a portion in the vicinity of a through hole. Thus, the multi-piece wiring substrate array poses a problem in that various types of special blades are required, which results in considerably high production cost and low productivity.

PRIOR ART DOCUMENT

Patent Document

Patent Document 1: Japanese Patent Application Laid-Open (kokai) No. 2009-218319 (pp. 1 to 11, FIGS. 1 to 8)

Patent Document 2: Japanese Patent Application Laid-Open (kokai) No. 2009-266992 (pp. 1 to 11, FIGS. 1 to 8)

SUMMARY OF THE INVENTION

Problems to be Solved by the Invention

An object of the present invention is to solve problems described in the Background Art section, and to provide a ceramic wiring substrate having few burrs in the vicinity of a notch provided on a side surface of a substrate main body, in which a conductor layer provided on the inner wall of the notch exhibits excellent solderability. Another object of the present invention is to provide a multi-piece ceramic wiring substrate array for providing a plurality of the wiring substrates. Yet another object of the present invention is to provide a method for reliably producing the wiring substrate array.

Means for Solving the Problems

In order to solve the aforementioned problems, the present invention has been achieved on the basis of the idea that each separation groove of a multi-piece wiring substrate array is formed such that the bottom of the groove is curved and deepened in the vicinity of a through hole in a thickness direction toward the bottom of the through hole.

Accordingly, the present invention provides a first ceramic wiring substrate (claim 1), comprising a substrate main body which has a rectangular shape in plan view, and which has a front surface and a back surface and has side surfaces, each being located between the front surface and the back surface, and having a groove surface located on a side toward the front surface and a fracture surface located on a side toward the back surface; and a notch which has a concave shape in plan view, and which is provided on at least one of the side surfaces so as to extend between the front surface and the back surface, the ceramic wiring substrate being characterized in that, in the side surface having the notch, the boundary between the groove surface and the fracture surface has curved portions on opposite sides of the notch, the curved portions being convex toward the front surface of the substrate main body in side view.

The present invention also provides a second ceramic wiring substrate (claim 2), comprising a substrate main body which has a rectangular shape in plan view, and which has a front surface and a back surface and has side surfaces, each being located between the front surface and the back surface, and having a groove surface located on a side toward the front surface and a fracture surface located on a side toward the back surface; and a notch which has a quarter arc shape in plan view, and which is provided at the corner formed by a pair of adjacent side surfaces so as to extend between the front surface and the back surface, the ceramic wiring substrate being characterized in that, in each of the paired side surfaces located on opposite sides of the notch, the boundary between the groove surface and the fracture surface has a curved portion on the corresponding side of the notch, the curved portion being convex toward the front surface of the substrate main body in side view.

The aforementioned substrate main body is formed of a single ceramic layer, or is formed by stacking a plurality of ceramic layers together. The ceramic layer is formed of, for example, a high-temperature fired ceramic material such as alumina or mullite, or a low-temperature fired ceramic material such as glass-ceramic material.

The wiring substrate is in any of the following forms: a form wherein a notch is provided at a middle portion of each of four side surfaces; a form wherein notches are provided at four corners, each corner being formed by a pair of adjacent side surfaces; or a form wherein these two types of notches are provided in combination.

The aforementioned groove surface corresponds to one of the inner wall surfaces of a separation groove exposed on each side surface of an individual wiring substrate, the wiring substrate being produced by separating a multi-piece wiring substrate array into individual pieces along separation grooves (each having a V-shaped or U-shaped cross section) formed, through the below-described laser processing, on the front surface of a large-sized green sheet or green sheet laminate which is to become the multi-piece wiring substrate array. Therefore, the groove surface is relatively smoother than the fracture surface (i.e., exposed surface of the ceramic substrate main body).

The notch of the first ceramic wiring substrate, which has a concave shape in plan view, has a semicircular or rectangular cross section in plan view.

The present invention also encompasses a ceramic wiring substrate (claim 3) wherein the fracture surface is sandwiched between the front-surface-side groove surface and a back-surface-side groove surface.

The present invention also encompasses a ceramic wiring substrate (claim 4) wherein an arc-shaped conductor layer is formed on a portion or the entirety of the inner wall of the notch, and a cut surface of the conductor layer forms a portion of the groove surface.

The present invention also provides a multi-piece ceramic wiring substrate array (claim 5), comprising a product region having a plurality of wiring substrate units which are adjacently arranged in a matrix form, each unit having a front surface and a back surface and having a rectangular shape in plan view; an edge portion which is located around the product region, and which has a front surface and a back surface and has a rectangular frame shape in plan view; separation grooves which are formed on at least a side toward the front surface of the product region and are arranged in a lattice shape in plan view, and which are provided between adjacent wiring substrate units and between the product region and the edge portion; and through holes each having a circular cross section, extending between the front surface and the back surface, and crossing with the corresponding separation groove in a radial direction in plan view, the multi-piece ceramic wiring substrate array being characterized in that each of the separation grooves has a bottom having a curved portion which is convex toward the front surface in side view; and the curved portion of each of the bottoms of a pair of separation grooves—end portions of the bottoms being exposed at symmetrical positions, in a radial direction, of the inner wall of the through hole—is located below a portion of the bottom other than its end portion, and on the side toward the back surface.

The present invention also encompasses a multi-piece ceramic wiring substrate array (claim 6) wherein the through hole is formed at a position where the separation grooves orthogonally cross each other in plan view, and also cross with the through hole in a radial direction thereof; and the curved portion of each of the bottoms of two pairs of separation grooves—end portions of the bottoms being exposed at intervals of 90° in a circumferential direction of the inner wall of the through hole—is located below a portion of the bottom other than its end portion, and on the side toward the back surface.

The present invention also encompasses a multi-piece ceramic wiring substrate array (claim 7) wherein separation grooves are formed on at least a side toward the back surface of the product region and are arranged in a lattice shape in plan view; and the back-surface-side separation grooves have bottoms having curved portions which are in line symmetry with respect to the front-surface-side curved portions.

The present invention also provides a method for producing a multi-piece ceramic wiring substrate array (claim 8), the multi-piece ceramic wiring substrate array comprising a product region having a plurality of wiring substrate units which are adjacently arranged in a matrix form, each unit having a front surface and a back surface and having a rectangular shape in plan view; an edge portion which is located around the product region, and which has a front surface and a back surface and has a rectangular frame shape in plan view; separation grooves which are formed on at least one of the front surface and the back surface of the product region and are arranged in a lattice shape in plan view, and which are provided between adjacent wiring substrate units and between the product region and the edge portion; and through holes each having a circular cross section, extending between the front surface and the back surface, and crossing with the corresponding separation groove in a radial direction in plan view, characterized in that the method comprises a step of forming a plurality of through holes at specific positions of a green sheet having a front surface and a back surface and having a rectangular shape in plan view; and a step of forming a plurality of separation grooves on at least one of the front surface and the back surface of the green sheet by continuously irradiating the green sheet with a laser beam while scanning the laser beam thereon, so that the separation grooves are arranged in a lattice shape in plan view so as to be provided around wiring substrate units and between a product region and an edge portion, and so that each of the separation grooves crosses with the corresponding through hole in a radial direction in plan view.

In the aforementioned multi-piece ceramic wiring substrate array production method, preferably, the insides of the through holes and the front or back surface of the green sheet are continuously irradiated with the laser beam for forming the separation grooves under the same conditions. Preferably, the laser processing is carried out so that the focal point of the laser beam is maintained at a generally constant level (position) in a thickness direction of the green sheet.

Effects of the Invention

According to the first ceramic wiring substrate of claim 1 or the second ceramic wiring substrate of claim 2, since the boundary between the groove surface and the fracture surface has curved portions on opposite sides of the notch, the curved portions being convex toward the front surface of the substrate main body in side view, the groove surface has a tapered extending portion defined by an end of the bottom of the groove surface, the inner wall of the notch, and each curved portion. Therefore, since the fracture surface (i.e., a relatively rough surface) is not located in the vicinity of the notch, which is provided at a middle portion of a side surface of the substrate main body of the first or second ceramic wiring substrate, or at the corner formed by a pair of adjacent side surfaces of the substrate main body, generation of ceramic burrs or the below-described breakage of the conductor layer is completely or almost completely suppressed. In addition, since a plating film is formed so as to cover a cut surface (end surface) of the conductor layer formed on the inner wall of the notch, the cut surface being adjacent to the extending portion of the groove surface and being exposed to the outside, the ceramic wiring substrate exhibits improved reliability when it is mounted on a motherboard, etc. by soldering.

According to the ceramic wiring substrate of claim 3, a pair of groove surfaces are located on each side surface of the substrate main body on the front surface side and the back surface side so as to be in line symmetry with each other, and extending portions of each groove surface, which are provided on ends of the bottom of the surface, are located on opposite sides of the notch. Therefore, generation of burrs or the below-described breakage of the conductor layer is further suppressed. In addition, since a plating film is formed so as to cover a cut surface of the conductor layer formed on the inner wall of the notch, the cut surface being adjacent to the extending portion of each of the front-surface-side and back-surface-side groove surfaces and being exposed to the outside, the ceramic wiring substrate exhibits further improved reliability during mounting by soldering.

According to the ceramic wiring substrate of claim 4, since a plating film is formed so as to reliably cover a cut surface (end surface) of the conductor layer, the cut surface being adjacent to the extending portion of at least one of the front-surface-side and back-surface-side groove surfaces and being exposed to the outside, reliability is secured during mounting of the ceramic wiring substrate by soldering.

According to the multi-piece ceramic wiring substrate array of claim 5, the bottom of each of separation grooves which are formed on the front surface side of the product region and are arranged in a lattice shape in plan view has—at the end in the vicinity of the inner wall of a through hole crossing with the separation groove—a curved portion which is convex toward the front surface in side view, and which is located below the bottom and on the side toward the back surface. When the product region is folded along the separation grooves for formation of individual wiring substrate units, the aforementioned through hole becomes notches of side surfaces of adjacent ceramic wiring substrates, each of the notches having a concave shape in plan view, and one of the inner wall surfaces of each separation groove becomes a groove surface of the wiring substrate. Since the curved portion is formed as described above, the aforementioned burrs or breakage is less likely to occur at the bottom of the groove surface and in the vicinity of opposite sides of the notch. In addition, an extending portion including the curved portion is formed. Furthermore, since a cut surface of the conductor layer formed on the inner wall of the notch of each ceramic wiring substrate—the cut surface being adjacent to the extending portion and being exposed to the outside—is covered with a plating film (e.g., Ni plating film or Au plating film) provided before formation of individual ceramic wiring substrates, reliability is improved during mounting of the ceramic wiring substrate by soldering.

According to the multi-piece ceramic wiring substrate array of claim 6, the bottom of each of two pairs of separation grooves which orthogonally cross each other has—at the end in the vicinity of the inner wall of a through hole crossing with the separation grooves—a curved portion which is convex toward the front surface in side view, and which is located below the bottom and on the side toward the back surface. When the product region is folded along the separation grooves for formation of individual wiring substrate units, the aforementioned through hole becomes notches at the corner formed by adjacent side surfaces of adjacent ceramic wiring substrates, each of the notches having a quarter arc shape in plan view, and one of the inner wall surfaces of each separation groove becomes a groove surface of the wiring substrate. Since the curved portion is formed as described above, the aforementioned burrs or breakage is less likely to occur at the bottom of the groove surface and in the vicinity of opposite sides of the notch. In addition, an extending portion including the curved portion is formed. Furthermore, in a manner similar to that described above, the conductor layer formed on the inner wall of the notch realizes improvement of reliability during mounting of the ceramic wiring substrate by soldering.

According to the multi-piece ceramic wiring substrate array of claim 7, separation grooves formed on the front surface and back surface of the product region have—at ends in the vicinity of the inner wall of a through hole crossing with the separation grooves—a pair of curved portions which are in line symmetry with each other, which are convex toward the front surface or the back surface in side view, and which are located on the side toward the back surface or the front surface with respect to the bottom of each of the aforementioned separation grooves. Therefore, when the product region is folded along the separation grooves for formation of individual ceramic wiring substrates, generation of ceramic burrs or breakage of the conductor layer is further suppressed in the vicinity of the notch on a side surface of each ceramic wiring substrate. In addition, reliability during mounting of the ceramic wiring substrate by soldering can be further secured by means of the conductor layer formed on the inner wall of the notch.

According to the multi-piece ceramic wiring substrate array production method of claim 8, there can be effectively and reliably produced a multi-piece ceramic wiring substrate array in which separation grooves formed on at least one of the front surface and back surface of the product region have, at ends in the vicinity of the inner wall of a through hole crossing with the separation grooves, a pair of curved portions which are in line symmetry with each other, which are convex toward the front surface or the back surface of the product region in side view, and which are located on the side toward the back surface or the front surface with respect to the bottom of each of the aforementioned separation grooves. In addition, since the separation grooves having the curved portions are formed through laser processing, a blade having a special shape is not required to be employed. Therefore, production cost can be reduced, and a groove formation step is readily controlled.

MODES FOR CARRYING OUT THE INVENTION

Embodiments of the present invention will next be described.

Figure 1:
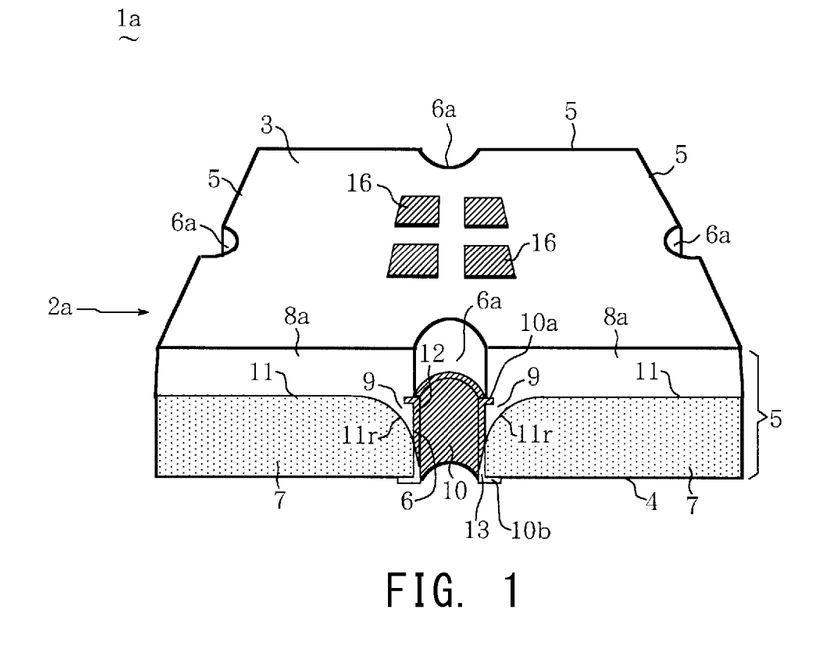
FIG. 1 is a perspective view of a first ceramic wiring substrate according to the present invention, as viewed from obliquely upward.

FIG. 1 is a perspective view of a first ceramic wiring substrate (hereinafter may be referred to simply as "wiring substrate") 1a according to the present invention, as viewed from obliquely upward.

As shown in FIG. 1, the first wiring substrate 1a includes a substrate main body 2a having a square (rectangular) shape in plan view. The substrate main body 2a has a front surface 3 and a back surface 4, and four side surfaces 5, each being located between the front surface 3 and the back surface 4. Each side surface 5 has a notch 6 formed at its middle portion in a horizontal direction, the notch 6 having a semicircular (concave) shape in plan view, and has, in addition to the notch 6, a groove surface 8a located on the side toward the front surface 3 and a fracture surface 7 located on the side toward the back surface 4. The substrate main body 2a is formed by stacking a plurality of ceramic layers (not illustrated), and the ceramic layers are formed of, for example, alumina.

The groove surface 8a corresponds to one of the inner wall surfaces of a separation groove formed through the below-described laser processing, and is smoother than the fracture surface 7 (i.e., an exposed surface of the alumina substrate main body). In the notch 6 of each side surface 5, an arc-shaped conductor layer 10 is formed on a portion of the inner wall of the notch 6 located on the side toward the back surface 4 (other than an inner wall portion 6a on the side toward the front surface 3). The conductor layer 10 is formed of W or Mo. A semicircular flange portion 10a extending to the groove surface 8a protrudes from the periphery of the upper end of the layer 10, and a semicircular flange portion 10b extending to the back surface 4 protrudes from the periphery of the lower end of the layer 10. The flange portion 10a may be conducted to internal wiring (not illustrated), and the flange portion 10b may be employed as a pad for an external connection terminal.

As shown in FIG. 1, in each side surface 5 having the notch 6 formed at its middle portion in a horizontal direction, the boundary 11 between the belt-like groove surface 8a located on the side toward the front surface 3 of the substrate main body 2a and the belt-like fracture surface 7 located on the side toward the back surface 4 of the substrate main body 2a has symmetrical curved portions 11r on opposite sides of the notch 6 in the longitudinal direction of the side surface 5, the curved portions 11r being convex toward the front surface 3 of the substrate main body 2a in side view. That is, each of the groove surfaces 8a located on opposite sides of the notch 6 has an extending portion 9 which is defined by an end of the bottom of the groove surface 8a, the inner wall of the notch 6, and each curved portion 11r, and which tapers from the groove surface 8a toward a middle portion between the front surface 3 and the back surface 4. Similar to the case of the groove surface 8a, the extending portion 9 is smoother than the fracture surface 7. Since the extending portion 9 is formed through the below-described laser processing, the extending portion 9 does not meander in the vicinity of the curved portion 11r, and has virtually no burrs in the vicinity thereof.

At the flange portion 10a of the conductor layer 10 formed on the inner wall of the notch 6, the flange portion 10a being located above the curved portion 11r, the inner peripheral surface of the conductor layer 10, and a cut surface (end surface) 12 of the conductor layer 10, a metalized layer formed of, for example, W is covered with a non-illustrated Ni plating film or Au plating film (hereinafter may be referred to simply as "plating film"). Meanwhile, the flange portion 10b of the conductor layer 10 located below the curved portion 11r, and a cut surface 13 of the conductor layer 10 are not covered with the aforementioned plating film. The aforementioned plating film is formed by electroplating of an inner exposed portion of a separation groove of a multi-piece ceramic wiring substrate array, the separation groove being formed through laser processing. The cut surface 12 of the conductor layer 10 forms a portion of the groove surface 8a.

A plurality of pads 16 connected to non-illustrated internal wiring are formed on the front surface 3 of the substrate main body 2a. A plurality of non-illustrated external connection terminals are formed on the back surface 4 of the substrate main body 2a. There is exposed, on the fracture surface 7 of each side surface 5, an end surface of a connection wire for plating, the wire being employed in the below-described plating step of a multi-piece ceramic wiring substrate array.

According to aforementioned first wiring substrate 1a, since the boundary 11 between the groove surface 8a and the fracture surface 7 has the curved portions 11r on opposite sides of the notch 6, the curved portions 11r being convex toward the front surface 3 of the substrate main body 2a in side view, the groove surface 8a has the tapered extending portion 9 defined by an end of the bottom of the groove surface 8a, the inner wall of the notch 6, and each curved portion 11r. Therefore, since the fracture surface 7 (i.e., a relatively rough surface) is not located in the vicinity of the notch 6, which is provided at a middle portion of each side surface 5 of the substrate main body 2a, generation of ceramic burrs or breakage of the conductor layer 10 is completely or almost completely suppressed.

In addition, since the plating film is formed so as to cover the cut surface 12 of the conductor layer 10 formed on the inner wall of the notch 6, the cut surface 12 being adjacent to the extending portion 9 of the groove surface 8a and being exposed to the outside, the wiring substrate 1a exhibits improved reliability when it is mounted on a motherboard, etc. by soldering.

Figure 2:
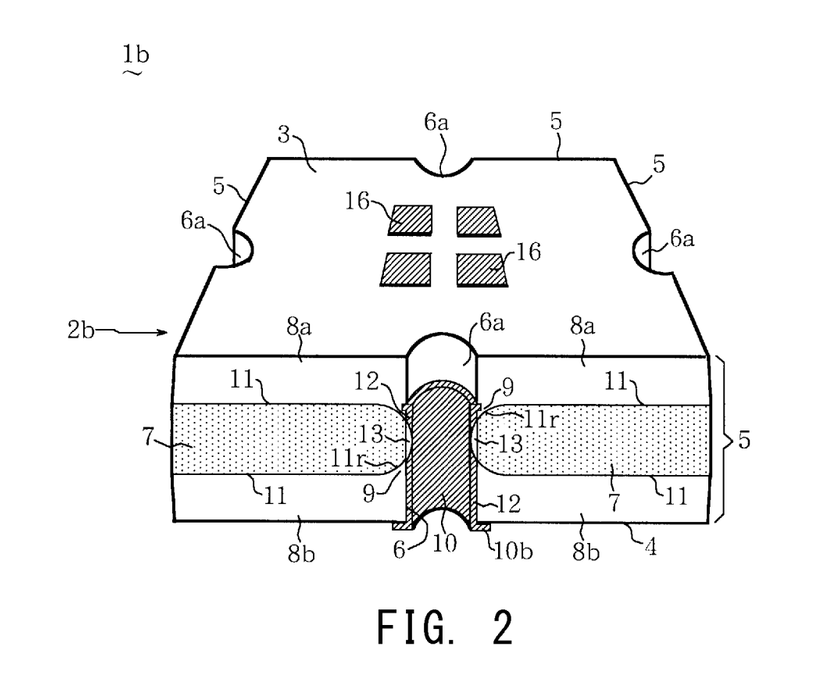
FIG. 2 is a perspective view of an applied embodiment of the aforementioned ceramic wiring substrate.

FIG. 2 is a perspective view of a wiring substrate 1b; i.e., an applied embodiment of the aforementioned wiring substrate 1a, which is shown in a manner similar to that above. As shown in FIG. 2, the wiring substrate 1b is formed of the aforementioned ceramic material, and includes a substrate main body 2b having a front surface 3, a back surface 4, and side surfaces 5. Each side surface 5 has a notch 6 formed in a manner similar to that described above. Each side surface 5 has, in addition to the notch 6, a pair of parallel belt-like groove surfaces 8a and 8b located on the sides toward the front surface 3 and the back surface 4, and a fracture surface 7 sandwiched between the groove surfaces 8a and 8b.

Unlike the case of the wiring substrate 1a, in the wiring substrate 1b, each side surface 5 has the groove surface 8b on the side toward the back surface 4, and the two boundaries 11

(i.e., the upper boundary 11 between the groove surface 8a and the fracture surface 7, and the lower boundary between the groove surface 8b and the fracture surface 7) have a pair of vertically symmetrical curved portions 11r, which are convex toward the front surface 3 and the back surface 4, respectively. Accordingly, the groove surfaces 8a and 8b have a pair of vertically symmetrical extending portions 9. As in the case of the wiring substrate 1a, the extending portions 9 have virtually no ceramic burrs in the vicinity of the curved portions 11r.

At flange portions 10a and 10b of the conductor layer 10 formed on the inner wall of the notch 6 (the flange portion 10a being located above the curved portion 11r on the side toward the front surface 3, and the flange portion 10b being located below the curved portion 11r on the side toward the back surface 4), the inner peripheral surface of the conductor layer 10, and a cut surface 12 of the conductor layer 10, a base portion formed of, for example, W is covered with a non-illustrated plating film. Meanwhile, an arc-shaped cut surface 13 of the conductor layer 10 sandwiched between the paired upper and lower curved portions 11r is not covered with the aforementioned plating film.

According to aforementioned wiring substrate 1b, since the fracture surface 7 (i.e., a relatively rough surface) is not located in the vicinity of the notch 6, which is provided on each side surface 5 of the substrate main body 2b, generation of ceramic burrs or breakage of the conductor layer 10 is further suppressed. In addition, since the plating film is formed so as to cover most of the cut surface (end surface) 12 of the conductor layer 10 formed on the inner wall of the notch 6, the wiring substrate 1b exhibits further improved reliability when it is mounted on a component by soldering.

The aforementioned wiring substrate 1a or 1b may be in a form in which each side surface 5 has two or more notches 6; conductor layers 10 whose number is the same as the notches 6 are provided; and curved portions 11r and extending portions 9 similar to those described above are provided on opposite sides of each notch 6.

Figure 3:
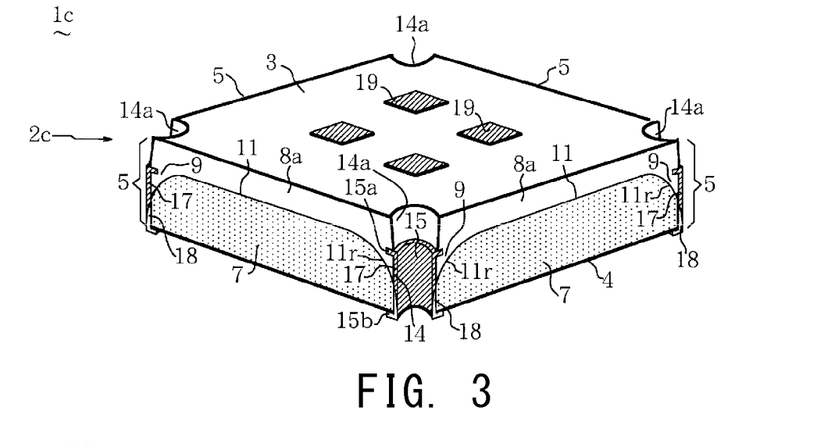
FIG. 3 is a perspective view of a second ceramic wiring substrate according to the present invention, which is shown in a manner similar to that above.

FIG. 3 is a perspective view of a second wiring substrate 1c according to the present invention, which is shown in a manner similar to that above.

As shown in FIG. 3, the second wiring substrate 1c is formed of the aforementioned ceramic material, and includes a substrate main body 2c having a front surface 3, a back surface 4, and side surfaces 5. A notch 14 having a quarter arc shape in plan view is provided at the corner formed by a pair of adjacent side surfaces 5 so as to extend between the front surface 3 and the back surface 4. Each side surface 5 has a groove surface 8a located on the side toward the front surface 3 and a fracture surface 7 located on the side toward the back surface 4.

In the notch 14, an arc-shaped conductor layer 15 is formed on a portion of the inner wall of the notch 14 located on the side toward the back surface 4 (other than an inner wall portion 14a on the side toward the front surface 3). The conductor layer 15 is also formed of, for example, W. A quarter-arc-shaped flange portion 15a extending to the groove surface 8a protrudes from the periphery of the upper end of the layer 15, and a quarter-arc-shaped flange portion 15b extending to the back surface 4 protrudes from the periphery of the lower end of the layer 15.

As shown in FIG. 3, in each side surface 5, the boundary 11 between the belt-like groove surface 8a located on the side toward the front surface 3 of the substrate main body 2c and the belt-like fracture surface 7 located on the side toward the back surface 4 has symmetrical curved portions 11r on opposite sides of the notch 14, the curved portions 11r being convex toward the front surface 3 of the substrate main body 2c in side view. That is, each of the groove surfaces 8a located on opposite sides of the notch 14 has an extending portion 9 which is defined by an end of the bottom of the groove surface 8a, the inner wall of the notch 14, and each curved portion 11r, and which tapers from the groove surface 8a. The extending portions 9 located on opposite sides of the notch 14 are symmetric with each other. Each of the extending portions 9 has virtually no burrs in the vicinity of the curved portion 11r.

For the above-described reasons, in the conductor layer 15 formed on the inner wall of the notch 14, the flange portion 15a located above the curved portion 11r, the inner peripheral surface of the conductor layer 15, and a cut surface (end surface) 17 of the conductor layer 15 are covered with a plating film in a manner similar to that described above. Meanwhile, the flange portion 15b located below the curved portion 11r and a cut surface 18 of the conductor layer 15 are not covered with the plating film.

The cut surface 17 of the conductor layer 15 forms a portion of the groove surface 8a. A plurality of pads 19 connected to non-illustrated internal wiring are formed on the front surface 3 of the substrate main body 2c. A plurality of non-illustrated external connection terminals are formed on the back surface 4 of the substrate main body 2c. In a manner similar to that described above, an end surface of a connection wire for plating is exposed on the fracture surface 7 of each side surface 5.

According to aforementioned second wiring substrate 1c, since the boundary 11 between the groove surface 8a and the fracture surface 7 has the curved portions 11r on opposite sides of the notch 14, the curved portions 11r being convex toward the front surface 3 of the substrate main body 2c in side view, the groove surface 8a has the tapered extending portion 9 defined by an end of the bottom of the groove surface 8a, the inner wall of the notch 14, and each curved portion 11r. Therefore, since the fracture surface 7 (i.e., a relatively rough surface) is not located in the vicinity of the notch 14 at the corner formed by a pair of adjacent side surfaces 5 of the substrate main body 2c, generation of the aforementioned burrs or breakage of the conductor layer 15 is completely or almost completely suppressed. In addition, since the plating film is formed so as to cover the cut surface (end surface) 17 of the conductor layer 15 formed on the inner wall of the notch 14, the cut surface 17 being adjacent to the extending portion 9 of the groove surface 8a and being exposed to the outside, the wiring substrate 1c exhibits improved reliability when it is mounted on a component by soldering.

Figure 4:
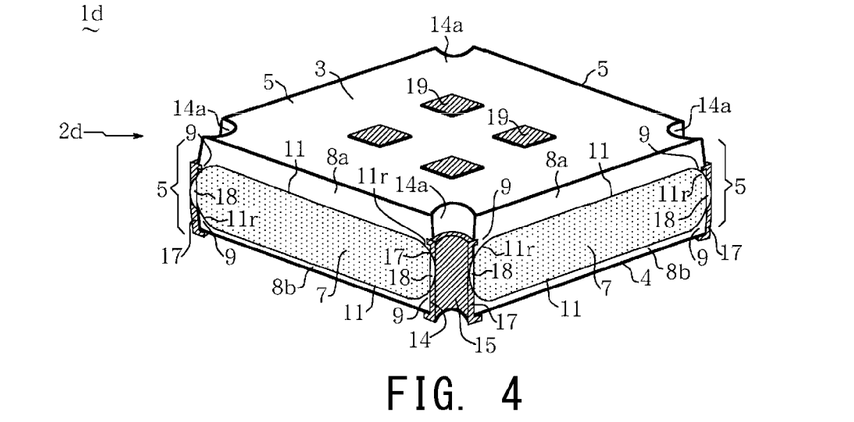
FIG. 4 is a perspective view of an applied embodiment of the aforementioned ceramic wiring substrate.

FIG. 4 is a perspective view of a wiring substrate 1d, which is an applied embodiment of the aforementioned wiring substrate 1c.

As shown in FIG. 4, the wiring substrate 1d is formed of the aforementioned ceramic material, and includes a substrate main body 2d having a front surface 3, a back surface 4, and side surfaces 5. A notch 14 is provided between adjacent side surfaces 5 in a manner similar to that described above. Each side surface 5 has a pair of parallel belt-like groove surfaces 8a and 8b located on the sides toward the front surface 3 and the back surface 4, and a fracture surface 7 sandwiched between the groove surfaces 8a and 8b.

Unlike the case of the wiring substrate 1c, in the wiring substrate 1d, each side surface 5 has the groove surface 8b on the side toward the back surface 4, and the two boundaries 11 (i.e., the upper boundary 11 between the groove surface 8a and the fracture surface 7, and the lower boundary between the groove surface 8b and the fracture surface 7) have a pair of vertically symmetrical curved portions 11r, which are convex toward the front surface 3 and the back surface 4, respectively.

Accordingly, the groove surfaces 8a and 8b have a pair of vertically symmetrical extending portions 9. As in the case of the wiring substrate 1c, the extending portions 9 have virtually no ceramic burrs in the vicinity of the curved portions 11r.

At flange portions 15a and 15b of the conductor layer 15 formed on the inner wall of the notch 14 (the flange portion 15a being located above the curved portion 11r on the side toward the front surface 3, and the flange portion 15b being located below the curved portion 11r on the side toward the back surface 4), the inner peripheral surface of the conductor layer 15, and a cut surface 17 of the conductor layer 15, a base portion formed of, for example, W is covered with a plating film. Meanwhile, a small arc-shaped cut surface 18 of the conductor layer 15 sandwiched between the paired upper and lower curved portions 11r is not covered with the aforementioned plating film.

According to aforementioned wiring substrate 1d, since the fracture surface 7 (i.e., a relatively rough surface) is not located in the vicinity of the notch 14 provided between the side surfaces 5, 5 of the substrate main body 2d, generation of ceramic burrs or breakage of the conductor layer 15 is further suppressed. In addition, since the plating film is formed so as to cover most of the cut surface 17 of the conductor layer 15 formed on the inner wall of the notch 14, the wiring substrate 1d exhibits further improved reliability when it is mounted on a component by soldering.

Figure 5:
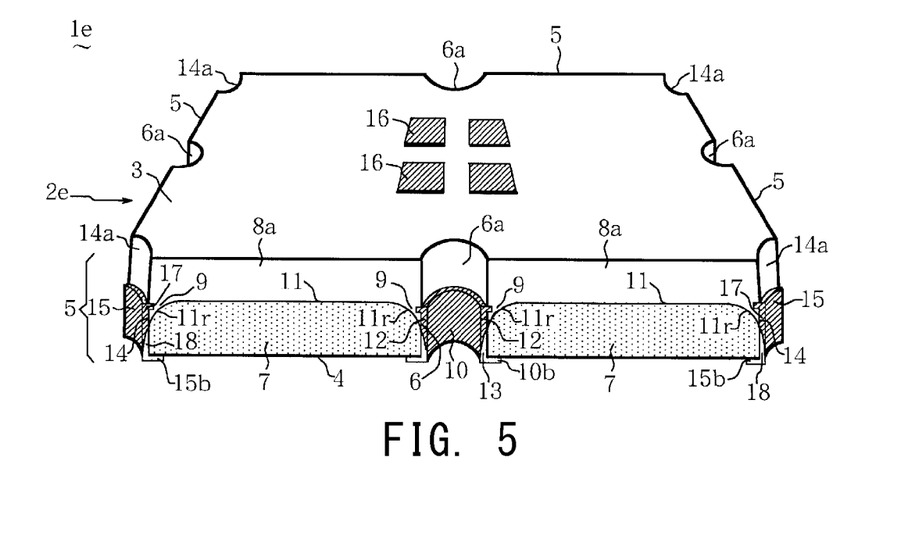
FIG. 5 is a perspective view of a ceramic wiring substrate according to the first and second applied embodiments, which is shown in a manner similar to that above.

FIG. 5 is a perspective view of a wiring substrate 1e, which has the configuration of the first wiring substrate 1a in combination with that of the second wiring substrate 1c.

As shown in FIG. 5, the wiring substrate 1e is formed of the aforementioned ceramic material, and includes a substrate main body 2e having a front surface 3, a back surface 4, and side surfaces 5. Each side surface 5 has a notch 6 formed at its middle portion in a manner similar to that described above, and also has a groove surface 8a located on the side toward the front surface 3 and a fracture surface 7 located on the side toward the back surface 4. Also, a notch 14 is provided between adjacent side surfaces 5, 5 in a manner similar to that described above.

In the notch 6 or 14, a conductor layer 10 or 15 similar to that described above is formed on a portion of the inner wall located on the side toward the back surface 4 (other than an inner wall portion 6a or 14a on the side toward the front surface 3). A semicircular flange portion 15a extending to the groove surface 8a protrudes from the periphery of the upper end of the conductor layer 10 or 15, and a semicircular flange portion 15b extending to the back surface 4 protrudes from the periphery of the lower end of the conductor layer 10 or 15.

In addition, on each side of the notch 6 or 14, a curved portion 11r and an extending portion 9 are located at an end of the boundary 11 between the groove surface 8a and the fracture surface 7. In the conductor layer 10 or 15 formed on the inner wall of the notch 6 or 14, the flange portion 10a or 15a located above the curved portion 11r, the inner peripheral surface of the conductor layer 10 or 15, and a cut surface 12 or 17 of the conductor layer 10 or 15 are covered with a plating film in a manner similar to that described above. Meanwhile, the flange portion 10b or 15b located below the curved portion 11r and a cut surface 13 or 18 of the conductor layer 10 or 15 are not covered with the aforementioned plating film.

According to aforementioned wiring substrate 1e, since the fracture surface 7 (i.e., a relatively rough surface) is not located in the vicinity of the notch 6 or 14, which is respectively provided at a middle portion of each side surface 5 of the substrate main body 2e or between adjacent side surfaces 5, 5 thereof, generation of the aforementioned burrs or breakage of the conductor layer 10 or 15 is further suppressed. In addition, since the plating film is formed so as to cover most of the cut surface 12 or 17 of the conductor layer 10 or 15 formed on the inner wall of the notch 6 or 14, the wiring substrate 1e exhibits further improved reliability when it is mounted on a component by soldering.

The aforementioned wiring substrate 1e may be in a form in which each side surface 5 has a groove surface 8b on the side toward the back surface 4 such that the groove surface 8b is in symmetry with respect to the groove surface 8a on the side toward the front surface 3, and curved portions 11r and extending portions 9 are provided at both ends of the boundary 11 between the groove surface 8b and the fracture surface 7 so as to be in symmetry with respect to those on the side toward the front surface 3.

Figure 6:
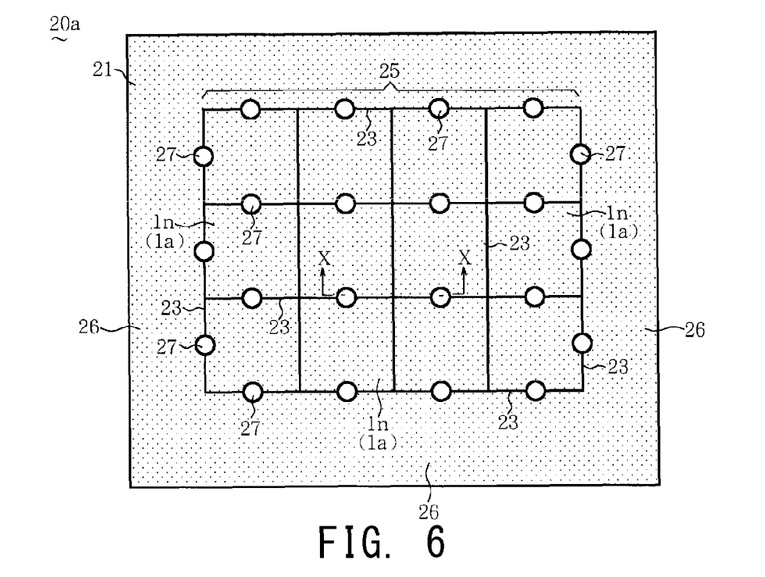
FIG. 6 is a plan view of a multi-piece ceramic wiring substrate array according to one embodiment of the present invention.
Figure 7:
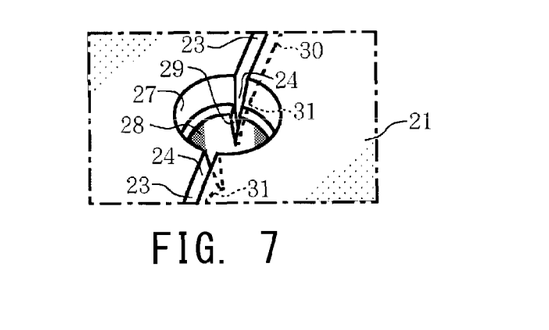
FIG. 7 is a partially enlarged perspective view of a portion in the vicinity of the opening of a through hole provided on the front surface of the wiring substrate array.
Figure 8:
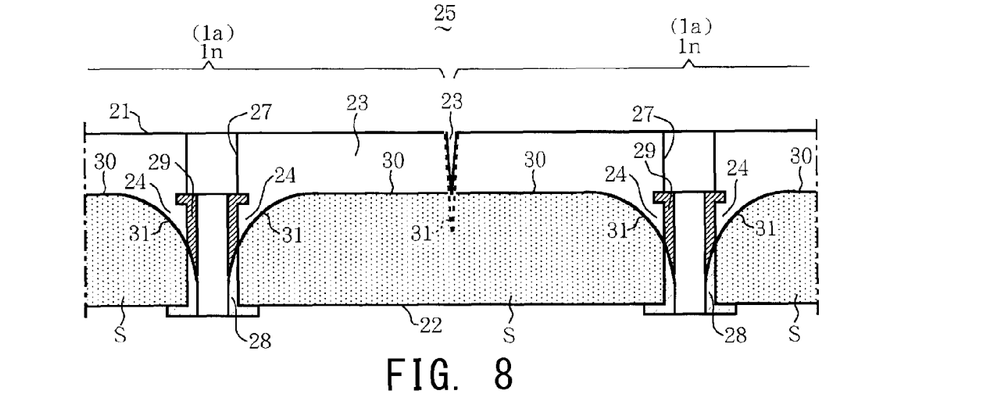
FIG. 8 is a partial, vertical cross-sectional view of the multi-piece ceramic wiring substrate array of FIG. 6 taken along line X-X.

FIG. 6 is a plan view of a multi-piece ceramic wiring substrate array (hereinafter may be referred to simply as "multi-piece wiring substrate array") 20a according to one embodiment of the present invention. FIG. 7 is a partially enlarged perspective view of a portion in the vicinity of the opening of a through hole 27 provided on a front surface 21 of the multi-piece wiring substrate array 20a. FIG. 8 is a partial, vertical cross-sectional view of the multi-piece wiring substrate array 20a of FIG. 6 taken along line X-X.

As shown in FIGS. 6 and 8, the multi-piece wiring substrate array 20a includes a product region 25 having a front surface 21 and a back surface 22, having a square (rectangular) shape in plan view, and having a plurality of wiring substrate units 1n (1a) which are adjacently arranged in a matrix form in plan view; an edge portion 26 which is located around the product region 25, and which has the front surface 21 and the back surface 22 and has a rectangular frame shape in plan view; and separation grooves 23 which are formed on the front surface 21 of the product region 25 and are arranged in a lattice shape in plan view, and which are provided between adjacent wiring substrate units 1n, 1n and between the product region 25 and the edge portion 26. Each separation groove 23 has a generally V-shaped or U-shaped cross section.

As in the case of the aforementioned wiring substrate 1a, etc., each of the product region 25 and the edge portion 26 is formed of a ceramic (alumina) laminate S prepared by stacking a plurality of ceramic layers together. The front surface 21 and the back surface 22 are common in the product region 25 and the edge portion 26. In addition, at the boundary between wiring substrate units 1n, 1n or between the product region 25 and the edge portion 26, connection wires for plating (not illustrated) for achieving electrical conduction between these internal wiring components cross with one another. Furthermore, a plurality of electrodes for plating (not illustrated) are formed at a pair of long sides of the edge portion 26.

Each of the wiring substrate units 1n is to become the aforementioned wiring substrate 1a through separation of the multi-piece wiring substrate array 20a into individual pieces. As shown in FIG. 6, in the vicinity of a middle portion (in plan view) of each of the separation grooves 23 defining four sides of each wiring substrate unit 1n, a through hole 27 having a circular cross section is formed so as to cross with the separation groove 23 in a radial direction, and to extend between the front surface 21 and the back surface 22.

As shown in FIGS. 7 and 8, a circular tubular conductor 28 formed of W or Mo is provided on an inner wall portion of each through hole 27 on the side toward the back surface 22. As shown in FIG. 8, the bottom 30 of the separation groove 23, which is formed through cutting of the ceramic laminate S in a horizontal direction, has a curved portion 31 at an end of each through hole 27 crossing with the separation groove 23, the curved portion 31 being convex toward the front surface 21 in side view.

That is, each of the separation grooves 23 located on opposite sides of the through hole 27 has a groove extending portion 24 which is defined by an end of the bottom 30 of the separation groove 23, the inner wall of the through hole 27, and each curved portion 31, and which tapers toward the bottom of the through hole 27 (toward a middle portion between the front surface 21 and the back surface 22). Similar to the case of the separation groove 23, the groove extending portion 24 is formed through the below-described laser processing. Therefore, the groove extending portion 24 does not meander in the vicinity of the curved portion 31, and has virtually no ceramic burrs in the vicinity thereof.

As shown in FIGS. 7 and 8, a pair of groove extending portions 24 having the curved portions 31 symmetrically extend to the tubular conductor 28 in a radial direction on the side toward the front surface 21. A cut surface (end surface) 29 covered with the aforementioned plating film (Ni plating film or Au plating film) is exposed on the inner wall of each groove extending portion 24. As shown in FIG. 8, at a middle portion (in a horizontal direction) of the separation groove 23, the separation groove 23 orthogonally crosses with another separation groove 23.

According to the aforementioned multi-piece wiring substrate array 20a, there is formed, at the end in the vicinity of the inner wall of the through hole 27 crossing with the separation groove 23, the curved portion 31 which is convex toward the front surface 21 in side view, and which is located below the bottom 30 of the separation groove 23 and on the side toward the back surface 22. Therefore, when the product region 25 is folded along the separation grooves 23 for separating the wiring substrate units 1n into a plurality of individual wiring substrates 1a, the aforementioned through hole 27 becomes notches 6 of side surfaces 5 of a pair of adjacent wiring substrates 1a, each of the notches 6 having a concave shape in plan view, and the inner wall surfaces of each separation groove 23 become a pair of groove surfaces 8a of the wiring substrate 1a. Since the curved portion 31 is formed as described above, generation of burrs of the ceramic laminate S or breakage of the conductor layer 10 is suppressed at the bottom of each groove surface 8a and in the vicinity of opposite sides of the notch 6. In addition, the extending portion 9 including the aforementioned curved portion 11r is formed. Furthermore, since a cut surface of the flange portion 10a of the conductor layer 10 formed on the inner wall of the notch 6 of each wiring substrate 1a—the cut surface being adjacent to the extending portion 9 and being exposed to the outside—is covered with a plating film provided before formation of individual wiring substrates, reliability is improved during mounting of the wiring substrate by soldering.

The separation groove 23, the groove extending portion 24, the curved portion 31, and the cut surface 29 of the tubular conductor 28 may also be formed on the side toward the back surface 22 of the product region 25 so as to be in line symmetry with respect to those on the side toward the front surface 21, to thereby produce a multi-piece wiring substrate array (20b) in which each wiring substrate unit 1n is to become the aforementioned wiring substrate 1b.

Figure 9:
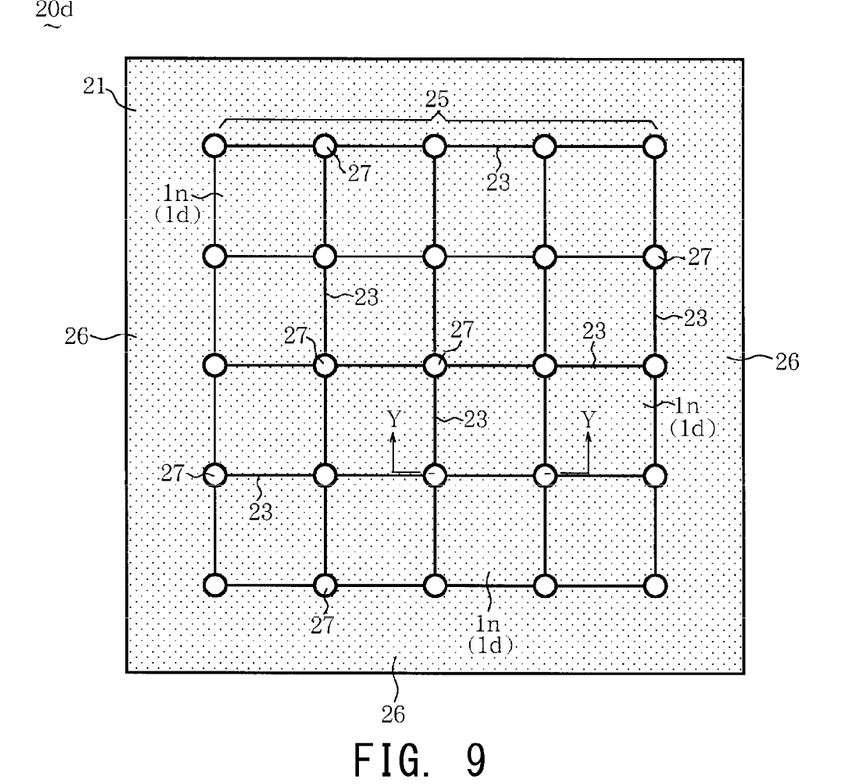
FIG. 9 is a plan view of a multi-piece ceramic wiring substrate array according to another embodiment of the present invention.
Figure 10:
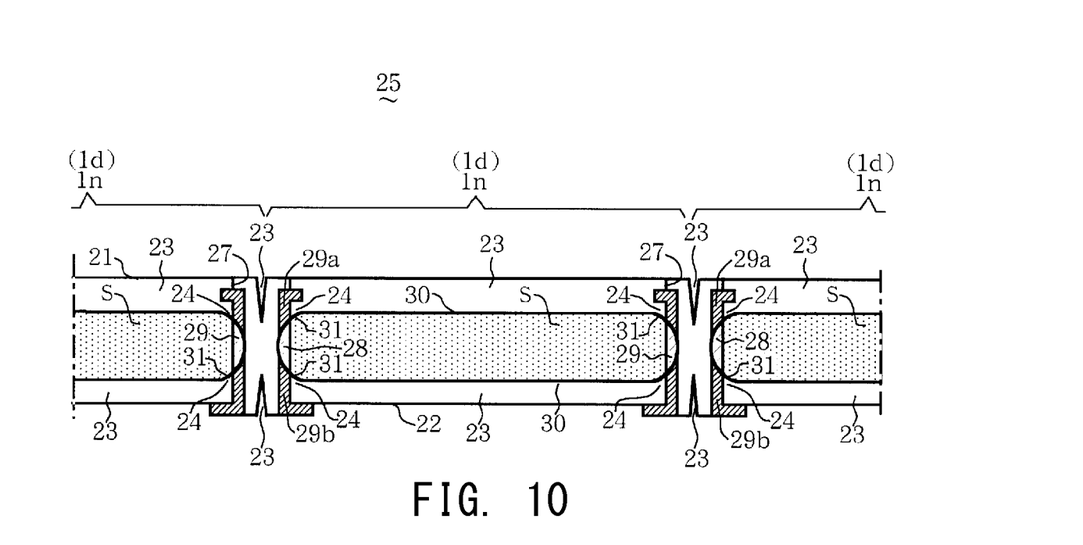
FIG. 10 is a partial, vertical cross-sectional view of the multi-piece ceramic wiring substrate array of FIG. 9 taken along line Y-Y.

FIG. 9 is a plan view of a multi-piece wiring substrate array 20d according to another embodiment of the present invention. FIG. 10 is a partial, vertical cross-sectional view of the multi-piece ceramic wiring substrate array 20d of FIG. 9 taken along line Y-Y.

As shown in FIGS. 9 and 10, the multi-piece wiring substrate array 20d includes a product region 25 formed of the aforementioned ceramic laminate, having a front surface 21 and a back surface 22 as in the aforementioned case, and having a plurality of wiring substrate units 1n (1d) which are adjacently arranged in a matrix form in plan view; an edge portion 26 which is located around the product region 25, and which has the front surface 21 and the back surface 22 and has a square (rectangular) frame shape in plan view; and separation grooves 23 which are formed on both the front surface 21 and the back surface 22 of the product region 25 and are arranged in a lattice shape in plan view, and which are provided between adjacent wiring substrate units 1n, 1n and between the product region 25 and the edge portion 26, such that the separation grooves 23 formed on the front surface 21 overlap with those formed on the back surface 22.

Each of the wiring substrate units 1n is to become the aforementioned wiring substrate 1d through separation of the multi-piece wiring substrate array 20d into individual pieces. As shown in FIG. 9, at each of four corners formed by the separation grooves 23 defining four sides of each wiring substrate unit 1n, a through hole 27 having a circular cross section is formed so as to cross with two pairs of the orthogonal separation grooves 23 in a radial direction, and to extend between the front surface 21 and the back surface 22.

As shown in FIG. 10, a circular tubular conductor 28 formed of W or Mo is provided on an inner wall portion of each through hole 27 on the side toward the back surface 22. As shown in FIG. 10, the bottoms 30 of a pair of the upper and lower separation grooves 23—which are formed through cutting, in a horizontal direction, of the ceramic laminate S in the vicinity of the front surface 21 and the back surface 22—have, at an end of each through hole 27 crossing with the separation grooves 23, a curved portion 31 which is convex toward the front surface 21 in side view, and a curved portion 31 which is convex toward the back surface 22 in side view, the curved portions 31 being in line symmetry with each other.

Thus, the separation grooves 23 located on opposite sides, in a radial direction, of each through hole 27 have groove extending portions 24 which are respectively located on the sides toward the front surface 21 and the back surface 22. Each of the groove extending portions 24 is defined by an end of the bottom 30 of each separation groove 23, the inner wall of the through hole 27, and each curved portion 31, and tapers toward the bottom of the through hole 27 (toward a middle portion between the front surface 21 and the back surface 22). Similar to the case of the separation groove 23, the groove extending portion 24 is formed through the below-described laser processing. Therefore, the groove extending portion 24 has virtually no burrs in the vicinity of the curved portion 31.

As shown in FIG. 10, a pair of groove extending portions 24 having the curved portions 31 symmetrically extend to the tubular conductor 28 in a radial direction on each of the sides toward the front surface 21 and the back surface 22. Cut surfaces (end surfaces) 29a and 29b covered with the aforementioned plating film are exposed on the inner walls of the groove extending portions 24. As shown in FIG. 10, at the upper and lower ends of each tubular conductor 28 crossing with the separation groove 23 in a horizontal direction, an end of another separation groove 23 (groove extending portion 24) orthogonally crossing with the separation groove 23 is exposed.

According to the aforementioned multi-piece wiring substrate array 20d, the separation grooves 23 formed on the front surface 21 and the back surface 22 have—in the vicinity of the inner wall of the through hole 27 crossing with the separation grooves 23—a pair of the curved portions 31 which are in line symmetry with each other, which are convex toward the front surface 21 or the back surface 22 in side view, and which are located on the side toward the back surface 22 or the front surface 21 with respect to the bottom 30 of each of the separation grooves 23. Therefore, when the product region 25 is folded along the separation grooves 23 for formation of individual wiring substrate units 1n (i.e., formation of a plurality of wiring substrates 1d), the aforementioned through hole 27 becomes notches 14 at the corner formed by side surfaces 5, 5 of a pair of adjacent wiring substrates 1d, each of the notches 14 having a quarter arc shape in plan view, and one of the inner wall surfaces of each separation groove 23 becomes groove surfaces 8a and 8b of the wiring substrate 1d. Since the curved portion is formed as described above, generation of the aforementioned burrs or breakage of the conductor layer is suppressed at the bottoms of the groove surfaces 8a and 8b and in the vicinity of opposite sides of each notch 14. In addition, the extending portion 9 including the curved portion 11r is formed.

Furthermore, since the cut surface 17 of the conductor layer 15 formed on the inner wall of the notch 14 of each wiring substrate 1d—the cut surface 17 being adjacent to the extending portion 9 and being exposed to the outside—is covered with a plating film provided before formation of individual wiring substrates, reliability is improved during mounting of the wiring substrate by soldering.

The separation groove 23, the groove extending portion 24, the curved portion 31, and the cut surface 29 of the tubular conductor 28 may be formed only on the side toward the front surface 21 of the product region 25, to thereby produce a multi-piece wiring substrate array (20c) in which each wiring substrate unit 1n is to become the aforementioned wiring substrate 1c. Also, the though holes 27, etc. of the multi-piece wiring substrate array 20a may be employed in combination with those of the multi-piece wiring substrate array 20d, to thereby produce a multi-piece wiring substrate array (e.g., 20e) in which each wiring substrate unit 1n is to become the aforementioned wiring substrate 1e.

Next will be described a method for producing the multi-piece wiring substrate array 20a.

Figure 11:
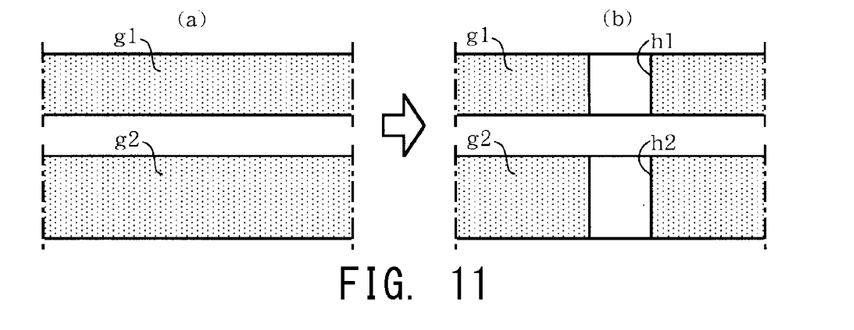
FIG. 11 schematically shows a step of producing the multi-piece ceramic wiring substrate array shown in FIGS. 6 to 8.

As shown in FIG. 11(a), there were provided in advance green sheets g1 and g2 having different thicknesses, each green sheet containing alumina powder (i.e., main component) and appropriate amounts of a binder resin and a solvent. Firstly, the green sheets g1 and g2 were subjected to a punching process by means of punches having the same outer diameter, to thereby form through holes h1 and h2 having the same inner diameter as shown in FIG. 11(b).

Figure 12:
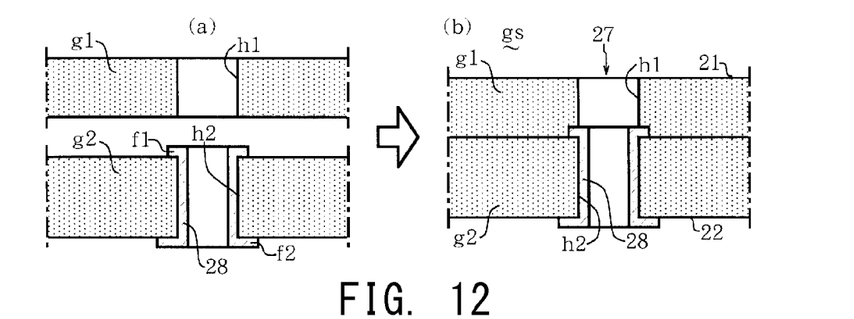
FIG. 12 schematically shows a production step subsequent to the step shown in FIG. 11.

Subsequently, as shown in FIG. 12(a), an electrically conductive paste containing W powder was applied to the inner wall of the through hole h2 of the green sheet g2 while the paste was aspirated under reduced pressure, to thereby form a circular tubular conductor 28. Then, the aforementioned electrically conductive paste was applied through printing to a ring-shaped portion of each of the front and back surfaces of the green sheet g2, the portion being adjacent to the opening of the through hole h2, to thereby form upper and lower flanges f1 and f2 on both ends of the tubular conductor 28.

Next, as shown in FIG. 12(b), the green sheets g1 and g2 were stacked together so that the center of the through hole h1 coincided with that of the through hole h2, to thereby form a green sheet laminate gs having a front surface 21 and a back surface 22. In this case, the through holes h1 and h2 communicated with each other, to thereby form a single through hole 27.

Figure 13:
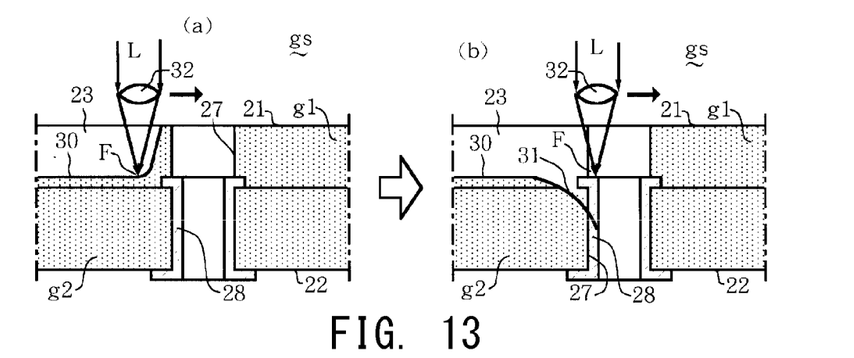
FIG. 13 schematically shows a production step subsequent to the step shown in FIG. 12.

Subsequently, as shown in FIG. 13(a), the front surface of the green sheet g1 was irradiated with a laser beam L in a thickness direction, and the laser beam L was continuously scanned along the front surface. The laser beam L employed was, for example, a UV-YAG laser beam. The focal point F of the laser beam L was maintained at a constant depth, and the laser beam L was scanned at a constant scan rate (about 100 mm/second).

In the case where a separation groove 23 having a V-shaped cross section was formed so as to have a depth of about 200 μm and an opening width of about 50 μm, irradiation of the laser beam L was carried out under the following conditions (frequency: about 30 to about 100 Hz, repetition number: 2 to 5).

Figure 14:
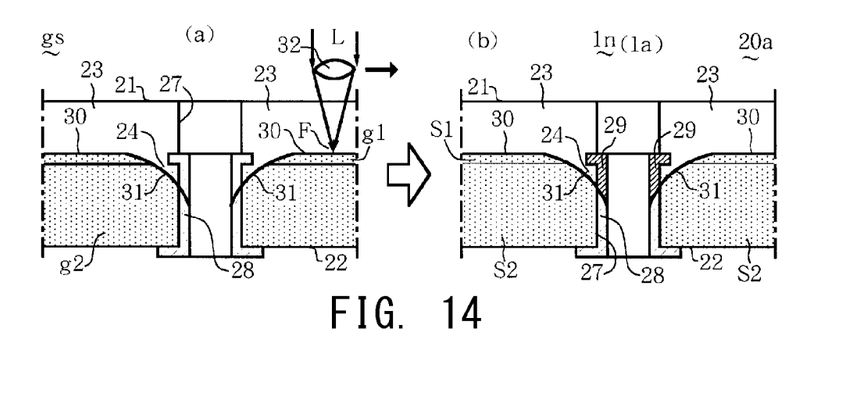
FIG. 14 schematically shows a production step subsequent to the step shown in FIG. 13.

As shown in FIG. 13(b) and FIG. 14(a), even when the laser beam L passed through the inside (hollow portion) of the through hole 27 in a radial direction, the focal point F of the laser beam L, the scan rate, and the aforementioned laser irradiation conditions were maintained constant. Thus, the laser beam L was continuously caused to pass through a center portion of the through hole 27 in a radial direction. In this case, the amount of energy of the laser beam L for processing was temporarily excessive at the inside (hollow portion) of the through hole 27 and the tubular conductor 28.

As a result, as shown in FIG. 13(b) and FIG. 14(a), symmetrical curved portions 31, each being convex toward the front surface, were formed at ends of the bottoms 30 of a pair of separation grooves 23 provided on opposite sides of the through hole 27, and a groove extending portion 24 communicating with each separation groove 23 was formed between each curved portion 31 and the through hole 27. The separations grooves 23, each including the groove extending portion 24, were formed on the front surface 21 of the green sheet laminate gs so as to be arranged in a lattice shape in plan view. The inner wall of the groove extending portion 24 includes a cut surface (29) of the tubular conductor 28, the cut surface being exposed on the side toward the front surface 21.

Subsequently, the green sheet laminate gs was fired at the firing temperature of the green sheets g1 and g2. As a result, the green sheets g1 and g2 were formed into integrated ceramic layers S1 and S2, whereby a ceramic laminate was produced. In this case, the tubular conductor 28, the internal wiring of each wiring substrate 1n, etc. were also fired in parallel.

Then, by means of the aforementioned electrodes for plating, etc., the above-produced ceramic laminate was subjected to Ni electroplating and Au electroplating by immersing the laminate in specific electroplating baths sequentially. As a result, as shown in FIG. 14(b), the inner peripheral surface of the tubular conductor 28, the surface being located above the curved portion 31 and exposed to the outside, was covered with an Ni plating film and an Au plating film, and the cut surface 29 of the tubular conductor 28 on the side toward the front surface 21, the cut surface 29 being exposed to the inner wall of the groove extending portion 24, was also covered with the Ni plating film and the Au plating film.

The multi-piece wiring substrate array 20a was produced through the above-described steps.

According to the aforementioned production method for the multi-piece wiring substrate array 20a, there can be effectively and reliably produced the multi-piece wiring substrate array 20a, in which the separation grooves 23 formed on the front surface 21 of the product region 25 have, at ends of the inner wall of the through hole 27 crossing with the separation grooves 23, a pair of the curved portions 31 which are in line symmetry with each other, which are convex toward the front surface 21 of the product region 25 in side view, and which are located on the side toward the back surface 22 with respect to the bottom 30 of each of the separation grooves 23.

In addition, since the separation grooves each including the groove extending portion 24 can be accurately and reliably formed through laser processing employing the aforementioned laser beam L, a blade having a special shape is not required to be employed. Therefore, production cost can be reduced, and a groove formation step is readily controlled.

There may be provided a method for producing a multi-piece wiring substrate array (20*b*) in which each wiring substrate unit 1*n* is to become the aforementioned wiring substrate 1*b*, the method further including a step of forming the separation grooves 23, the groove extending portion 24, the curved portion 31, and the cut surface 29 of the tubular conductor 28 also on the side toward the back surface 22 of the product region 25 so that they are in line symmetry with respect to those on the side toward the front surface 21.

Also, there may be provided a method for producing a multi-piece wiring substrate array (20*c*, 20*d*, or 20*e*) in which each wiring substrate unit 1*n* is to become the aforementioned wiring substrate 1*c*, 1*d*, or 1*e*, the method including a step of forming the through hole 27, the tubular conductor 28, etc. in the vicinity of each of crossing points of the orthogonal separation grooves 23 which are formed on one or both of the front surface 21 and the back surface 22 of the product region 25 and are arranged in a lattice shape in plan view.

The present invention is not limited to the above-described embodiments.

For example, the aforementioned wiring substrate or multi-piece wiring substrate array may be formed of a high-temperature fired ceramic material other than alumina (e.g., aluminum nitride or mullite), or may be formed of a low-temperature fired ceramic material such as glass-ceramic material. In the latter case, the aforementioned conductor (e.g., the conductor layer 10 or the tubular conductor 28) is formed of Cu or Ag.

The aforementioned wiring substrate or multi-piece wiring substrate array may be formed of a single ceramic layer, or a ceramic laminate including three or more ceramic layers.

The aforementioned substrate main body may have a rectangular shape in plan view.

The aforementioned wiring substrate 1*a*, etc. may be in a form in which, for example, the substrate main body 2*a* has, on the front surface 3, a cavity which is open on the side toward the front surface 3 and which has a bottom surface and side surfaces.

The aforementioned conductor layer 10 or 15 may be formed on the entire inner wall of the notch 6 or 14.

In the multi-piece wiring substrate array production method, the laser processing may be appropriately carried out so that the laser irradiation conditions for the inside of the through hole 27 differ from those for the front surface of the green sheet g1, etc.

The aforementioned multi-piece wiring substrate array production method may be continuously followed by a step of separating the wiring substrate array into individual wiring substrates.

INDUSTRIAL APPLICABILITY

According to the present invention, there can be effectively and reliably provided a ceramic wiring substrate having few burrs in the vicinity of a notch provided on a side surface of a substrate main body, in which a conductor layer provided on the inner wall of the notch exhibits excellent solderability, as well as a multi-piece ceramic wiring substrate array for providing a plurality of the wiring substrates.

DESCRIPTION OF REFERENCE NUMERALS

1*a* to 1*e*: wiring substrate (ceramic wiring substrate)
1*n*: wiring substrate unit
2*a* to 2*e*: substrate main body
3, 21: front surface
4, 22: back surface
5: side surface
6, 14: notch
7: fracture surface
8*a*, 8*b*: groove surface
9: extending portion
10, 15: conductor layer
11: boundary
11*r*: curved portion
12, 17: cut surface
20*a* to 20*e*: multi-piece wiring substrate array (multi-piece ceramic wiring substrate array)
23: separation groove
24: groove extending portion
25: product region
26: edge portion
27: through hole
30: bottom of separation groove
31: curved portion of separation groove
g1, g2: green sheet
h1, h2: through hole
L: laser beam
S: ceramic laminate

What is claimed is:

1. A ceramic wiring substrate comprising:
a substrate main body which has a rectangular shape in plan view, and which has a front surface and a back surface and has side surfaces, each being located between the front surface and the back surface, and having a groove surface located on a side toward the front surface and a fracture surface located on a side toward the back surface; and
a notch which has a concave shape in plan view, and which is provided on at least one of the side surfaces so as to extend between the front surface and the back surface, the ceramic wiring substrate being characterized in that:
in the side surface having the notch, the boundary between the groove surface and the fracture surface has curved portions on opposite sides of the notch, the curved portions being convex toward the front surface of the substrate main body in side view.

2. A ceramic wiring substrate comprising:
a substrate main body which has a rectangular shape in plan view, and which has a front surface and a back surface and has side surfaces, each being located between the front surface and the back surface, and having a groove surface located on a side toward the front surface and a fracture surface located on a side toward the back surface; and
a notch which has a quarter arc shape in plan view, and which is provided at the corner formed by a pair of adjacent side surfaces so as to extend between the front surface and the back surface, the ceramic wiring substrate being characterized in that:
in each of the paired side surfaces located on opposite sides of the notch, the boundary between the groove surface and the fracture surface has a curved portion on the corresponding side of the notch, the curved portion being convex toward the front surface of the substrate main body in side view.

3. A ceramic wiring substrate according to claim 1, wherein the fracture surface is sandwiched between the front-surface-side groove surface and a back-surface-side groove surface.

4. A ceramic wiring substrate according to claim 1, wherein an arc-shaped conductor layer is formed on a portion or the entirety of the inner wall of the notch, and a cut surface of the conductor layer forms a portion of the groove surface.

5. A multi-piece ceramic wiring substrate array comprising:
- a product region having a plurality of wiring substrate units which are adjacently arranged in a matrix form, each unit having a front surface and a back surface and having a rectangular shape in plan view;
- an edge portion which is located around the product region, and which has a front surface and a back surface and has a rectangular frame shape in plan view;
- separation grooves which are formed on at least a side toward the front surface of the product region and are arranged in a lattice shape in plan view, and which are provided between adjacent wiring substrate units and between the product region and the edge portion; and
- through holes each having a circular cross section, extending between the front surface and the back surface, and crossing with the corresponding separation groove in a radial direction in plan view, the multi-piece ceramic wiring substrate array being characterized in that
- each of the separation grooves has a bottom having a curved portion which is convex toward the front surface in side view; and
- the curved portion of each of the bottoms of a pair of separation grooves—end portions of the bottoms being exposed at symmetrical positions, in a radial direction, of the inner wall of the through hole—is located below a portion of the bottom other than its end portion, and on the side toward the back surface.

6. A multi-piece ceramic wiring substrate array according to claim 5, wherein the through hole is formed at a position where the separation grooves orthogonally cross each other in plan view, and also cross with the through hole in a radial direction thereof; and the curved portion of each of the bottoms of two pairs of separation grooves—end portions of the bottoms being exposed at intervals of 90° in a circumferential direction of the inner wall of the through hole—is located below a portion of the bottom other than its end portion, and on the side toward the back surface.

7. A multi-piece ceramic wiring substrate array according to claim 5, wherein separation grooves are formed on at least a side toward the back surface of the product region and are arranged in a lattice shape in plan view; and the separation grooves on the side toward the back surface have bottoms having curved portions which are in line symmetry with respect to the curved portions on the side toward the front surface.

8. A method for producing a multi-piece ceramic wiring substrate array, the multi-piece ceramic wiring substrate array comprising:
- a product region having a plurality of wiring substrate units which are adjacently arranged in a matrix form, each unit having a front surface and a back surface and having a rectangular shape in plan view;
- an edge portion which is located around the product region, and which has a front surface and a back surface and has a rectangular frame shape in plan view;
- separation grooves which are formed on at least one of the front surface and the back surface and are arranged in a lattice shape in plan view, and which are provided between adjacent wiring substrate units and between the product region and the edge portion; and
- through holes each having a circular cross section, extending between the front surface and the back surface, and crossing with the corresponding separation groove in a radial direction in plan view, characterized in that the method comprises:
- a step of forming a plurality of through holes at specific positions of a green sheet having a front surface and a back surface and having a rectangular shape in plan view; and
- a step of forming a plurality of separation grooves on at least one of the front surface and the back surface of the green sheet by continuously irradiating the green sheet with a laser beam while scanning the laser beam thereon, so that the separation grooves are arranged in a lattice shape in plan view so as to be provided around wiring substrate units and between a product region and an edge portion, and so that each of the separation grooves crosses with the corresponding through hole in a radial direction in plan view.

9. A ceramic wiring substrate according to claim 2, wherein the fracture surface is sandwiched between the front-surface-side groove surface and a back-surface-side groove surface.

10. A ceramic wiring substrate according to claim 2, wherein an arc-shaped conductor layer is formed on a portion or the entirety of the inner wall of the notch, and a cut surface of the conductor layer forms a portion of the groove surface.

* * * * *